(12) United States Patent  
Wang et al.

(10) Patent No.: US 8,000,120 B2  
(45) Date of Patent: Aug. 16, 2011

(54) READ AND MATCH CIRCUIT FOR LOW-VOLTAGE CONTENT ADDRESSABLE MEMORY

(75) Inventors: Jinn-Shyan Wang, Chia-yi (TW); Tai-An Chen, Tainan (TW)

(73) Assignee: National Chung Cheng University, Chia-Yi (TW)

( * ) Notice: Subject to any disclaimer, the term of this patent is extended or adjusted under 35 U.S.C. 154(b) by 142 days.

(21) Appl. No.: 12/436,883

(22) Filed: May 7, 2009

(65) Prior Publication Data

US 2010/0142242 A1 Jun. 10, 2010

(30) Foreign Application Priority Data

Dec. 5, 2008 (TW) ................................. 97147568 A

(51) Int. Cl.
*G11C 15/00* (2006.01)

(52) U.S. Cl. ..................... 365/49.1; 365/49.17; 365/198; 365/203

(58) Field of Classification Search ............... 365/49.17, 365/198, 203, 49.1

See application file for complete search history.

(56) References Cited

U.S. PATENT DOCUMENTS

| | | | | |
|---|---|---|---|---|
| 6,707,692 | B2 * | 3/2004 | Hata | 365/49.17 |
| 7,019,999 | B1 * | 3/2006 | Srinivasan et al. | 365/49.1 |
| 7,050,318 | B1 * | 5/2006 | Argyres | 365/49.15 |
| 7,830,691 | B2 * | 11/2010 | Srinivasan et al. | 365/189.07 |

* cited by examiner

*Primary Examiner* — Pho M Luu

(74) *Attorney, Agent, or Firm* — Ming Chow; Sinorica, LLC

(57) ABSTRACT

A read, write, and match circuit for a low-voltage content addressable memory. A write circuit inputs signals for storing data in the memory cells, a read circuit retrieves the stored data from the memory cells, and a match circuit compares the data stored in the memory cell with the data searched by the match circuit. The circuits for writing, reading and matching are separated from each other and exempt from mutual interference.

14 Claims, 18 Drawing Sheets

READ AND MATCH CIRCUIT FOR LOW-VOLTAGE CONTENT ADDRESSABLE MEMORY

BACKGROUND OF THE INVENTION

1. Field of the Invention

The present invention relates to a logic circuit, particularly to a read and match circuit for a low-voltage content addressable memory.

2. Description of the Related Art

A content addressable memory (CAM) not only stores data but also compares data. Therefore, a CAM cell not only has circuits for reading and writing data but also has transistors for matching data, wherein the data in the memory array is simultaneously compared with the searched data input externally. The mass parallel comparison operation has an advantage of high speed and a disadvantage of high power consumption.

Refer to FIG. 1 for the architecture of bit lines in a conventional technology. Suppose that Node n1 is at a logic state of 1 and Node n2 is at a logic state of 0 in the memory cell 10, and suppose that the word line WLv is at a logic state of 1 and the bit lines BL and BLn are at a logic state of 1 in a reading activity. The partial voltage will cause a slight voltage rise in Node n2. Thus, the static noise margin is decreased, and the external noise is more likely to affect the stability of the stored data. Once the noise exceeds the allowance, the stored data is damaged.

The influence of current leakage is another problem. Suppose that Node n1, Node n2, Node n3, and Node n4 are respectively at logic states of 1, 0, 0, and 1 in the memory cell 10, and suppose that Node n1 and Node n3 are at a logic state of 0 in the memory cell 12. In a reading activity, the word line WLv is at a logic state of 1, and the bit lines BL and BLn are at a logic state of 1 and at a floating state. The current leakage in the transistor 122 of the memory cell 12 will cause a voltage decrease in the bit line BL, and an error thus occurs.

Refer to FIG. 2 for a NOR-type match-line circuit in a conventional technology. When executing a reading activity at a low voltage, the memory cell 20 also has the problems of static noise margin and bit-line current leakage. The circuit further has a problem that the match line ML is affected by leakage current. Suppose that Node n1 is at a logic state of 1 and Node n2 is at a logic state of 0 in the memory cell 20, and suppose that the search line SL is at a logic state of 1 and the search line SLn is at a logic state of 0. Then, the transistors 201 and 204 are at a conduction state, and the transistors 202 and 203 are at a disconnection state. The current leakage in the transistors 202 and 203 will lower the voltage level of the match line ML, and an error thus occurs.

Accordingly, the present invention proposes a read and match circuit for a low-voltage content addressable memory to overcome the abovementioned problems.

SUMMARY OF THE INVENTION

The primary objective of the present invention is to provide a read and match circuit for a low-voltage content addressable memory, wherein the data stored in memory cells is not read directly but controls the gates of the transistors of the read circuit to realize reading activities, whereby the static noise margin of reading stored signal of the memory cells is increased, and the memory cells have higher stability.

Another objective of the present invention is to provide a read and match circuit for a low-voltage content addressable memory, wherein the transistor stack technology is used to increase the threshold voltage of transistors and decrease the leakage current of the bit lines in the unread memory cells, whereby the bit lines are less likely to be affected by leakage current.

Still another objective of the present invention is to provide a read and match circuit for a low-voltage content addressable memory, wherein the transistor stack technology is used to increase the threshold voltage of transistors and decrease the leakage current of the match lines in the memory cells, whereby the match lines are less likely to be affected by leakage current.

A further objective of the present invention is to provide a read and match circuit for a low-voltage content addressable memory, whereby the user can determine whether to have high speed or to have low power consumption.

To achieve the abovementioned objectives, the present invention proposes a read and match circuit for a low-voltage content addressable memory, which comprises a write circuit undertaking writing activities and storing data; a binary/ternary setting circuit controlling transmission of match signals; a read circuit connected with the write circuit and reading a logic signal stored in a memory cell; and a match circuit including a data match circuit, a binary/ternary transmission circuit and a match output circuit, connected with the write circuit and the binary/ternary setting circuit, and comparing the stored data with the searched data input externally.

Below, the embodiments are described in detail to make easily understood the objectives, technical contents, characteristics and accomplishments of the present invention.

DETAILED DESCRIPTION OF THE INVENTION

In the conventional technologies, none CAM can be operated in a sub-threshold voltage. The present invention revises the original CAM circuit to realize the sub-threshold operation of CAM. At the same time, the present invention also takes into consideration of CAM size. Thus, the present invention proposes an optimized design of CAM to compromise the stability, reliability and size thereof.

Figure 1:
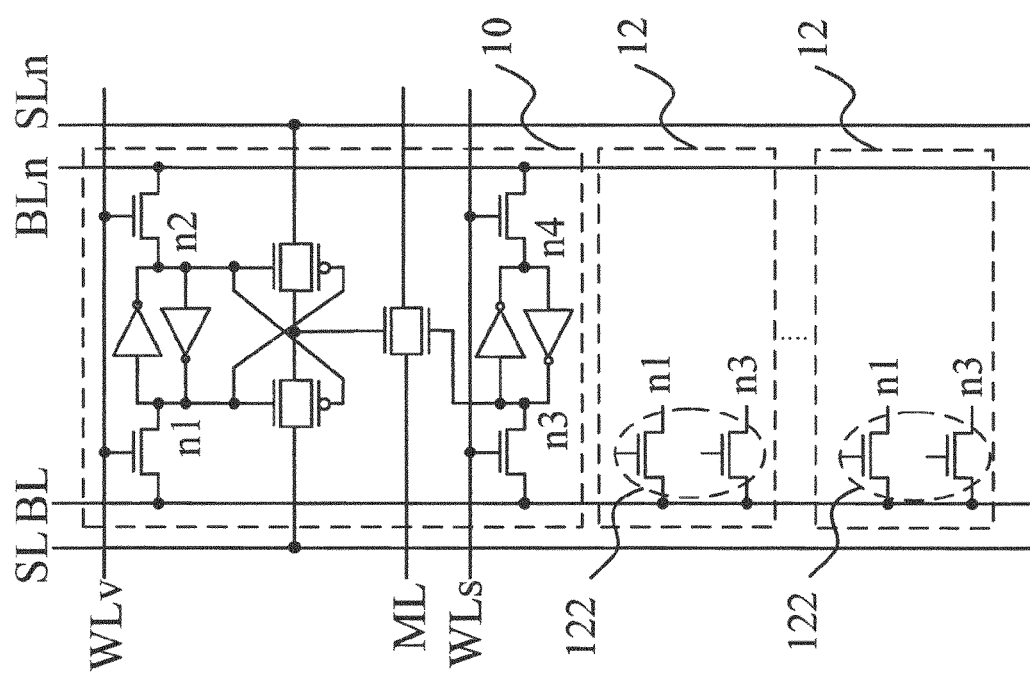
FIG. 1 is a diagram showing the architecture of bit lines in a conventional technology.
Figure 2:
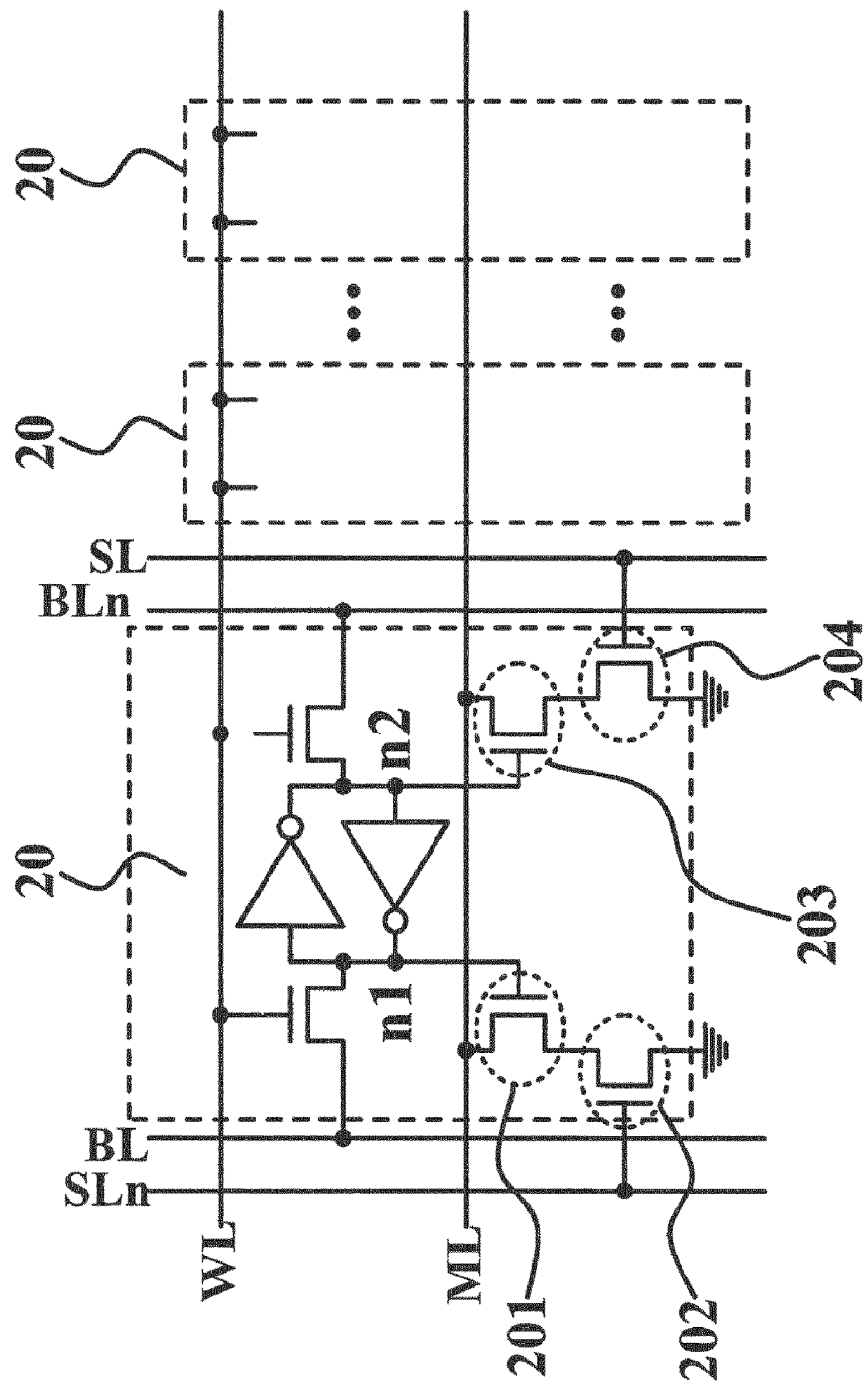
FIG. 2 is a diagram showing a NOR-type match-line circuit in a conventional technology.
Figure 3:
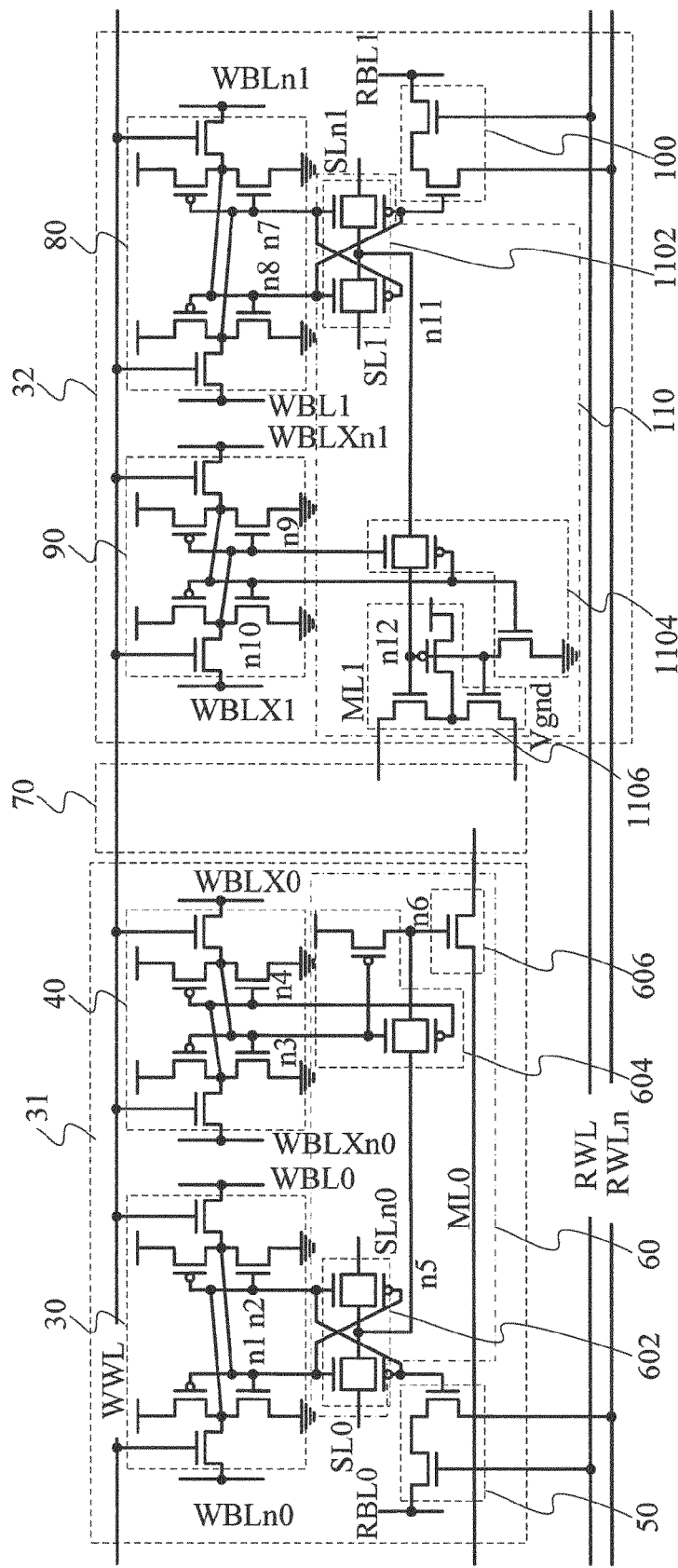
FIG. 3 is a diagram showing a NAND-type ternary CAM cell and a NOR-type ternary CAM cell according to the present invention.
Figure 4:
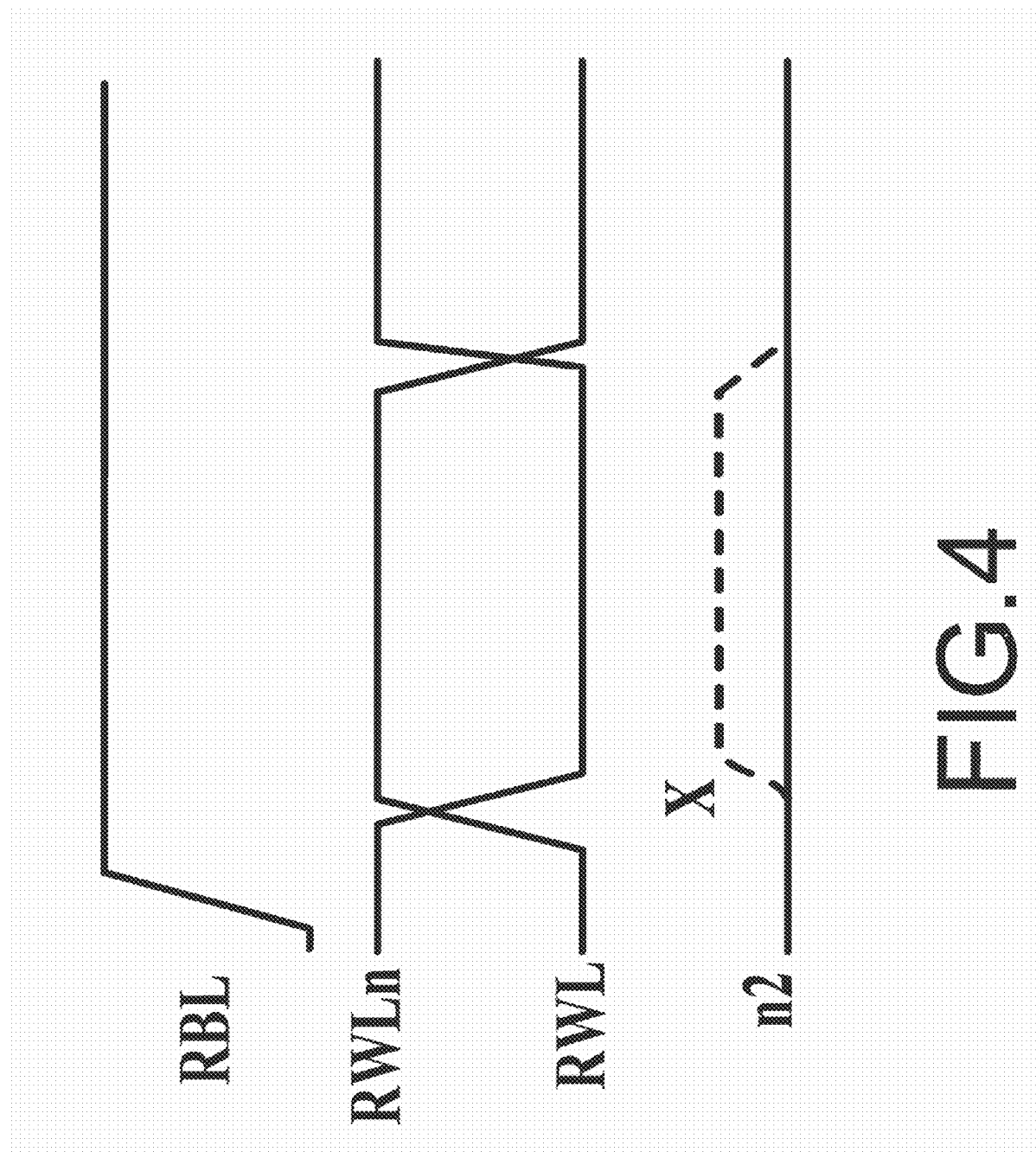
FIG. 4 is a diagram showing the waveforms of a NAND-type ternary CAM cell in a reading activity according to the present invention.
Figure 5:
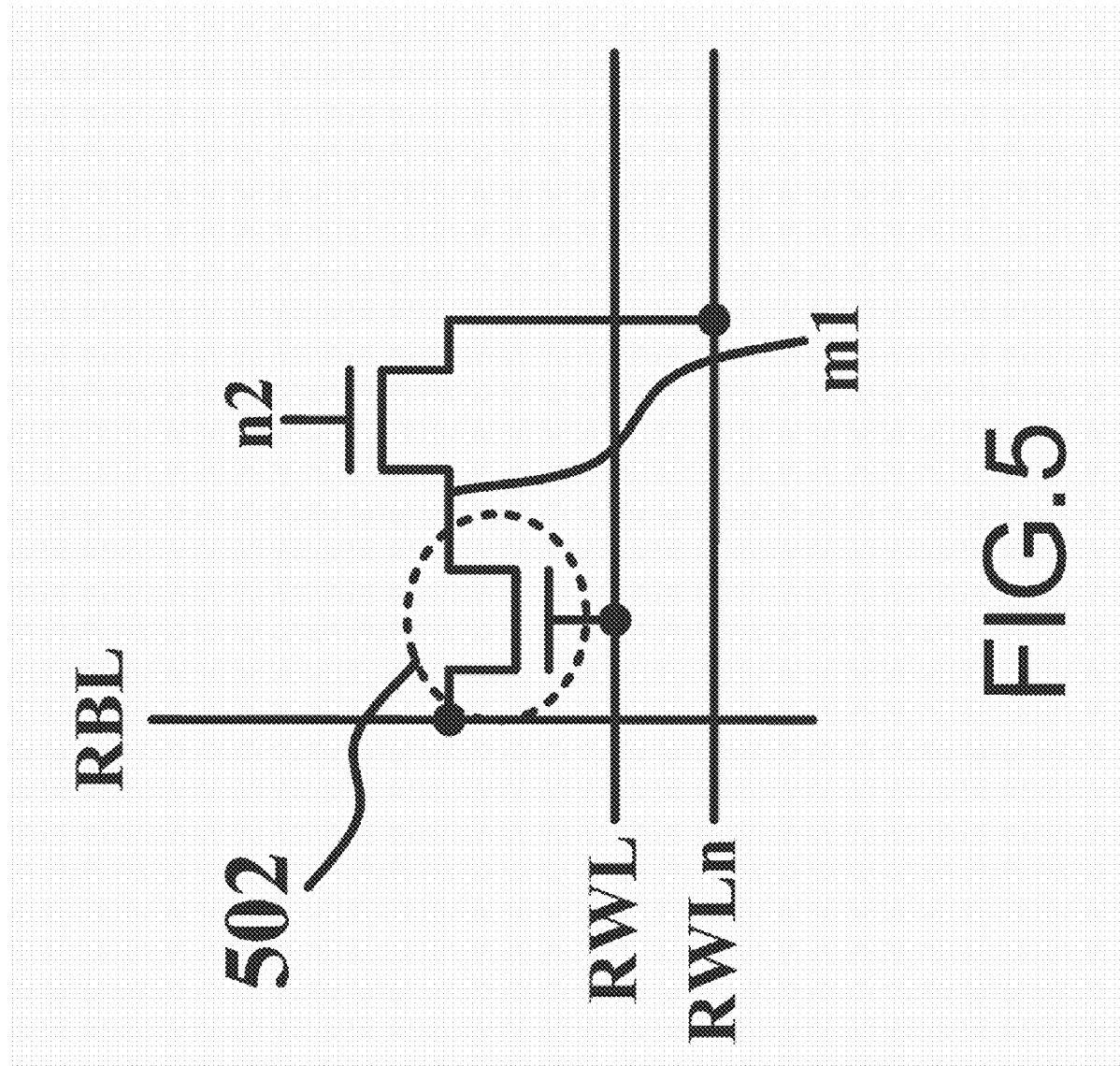
FIG. 5 is a diagram showing a read circuit of a NAND-type ternary CAM cell according to the present invention.
Figure 6:
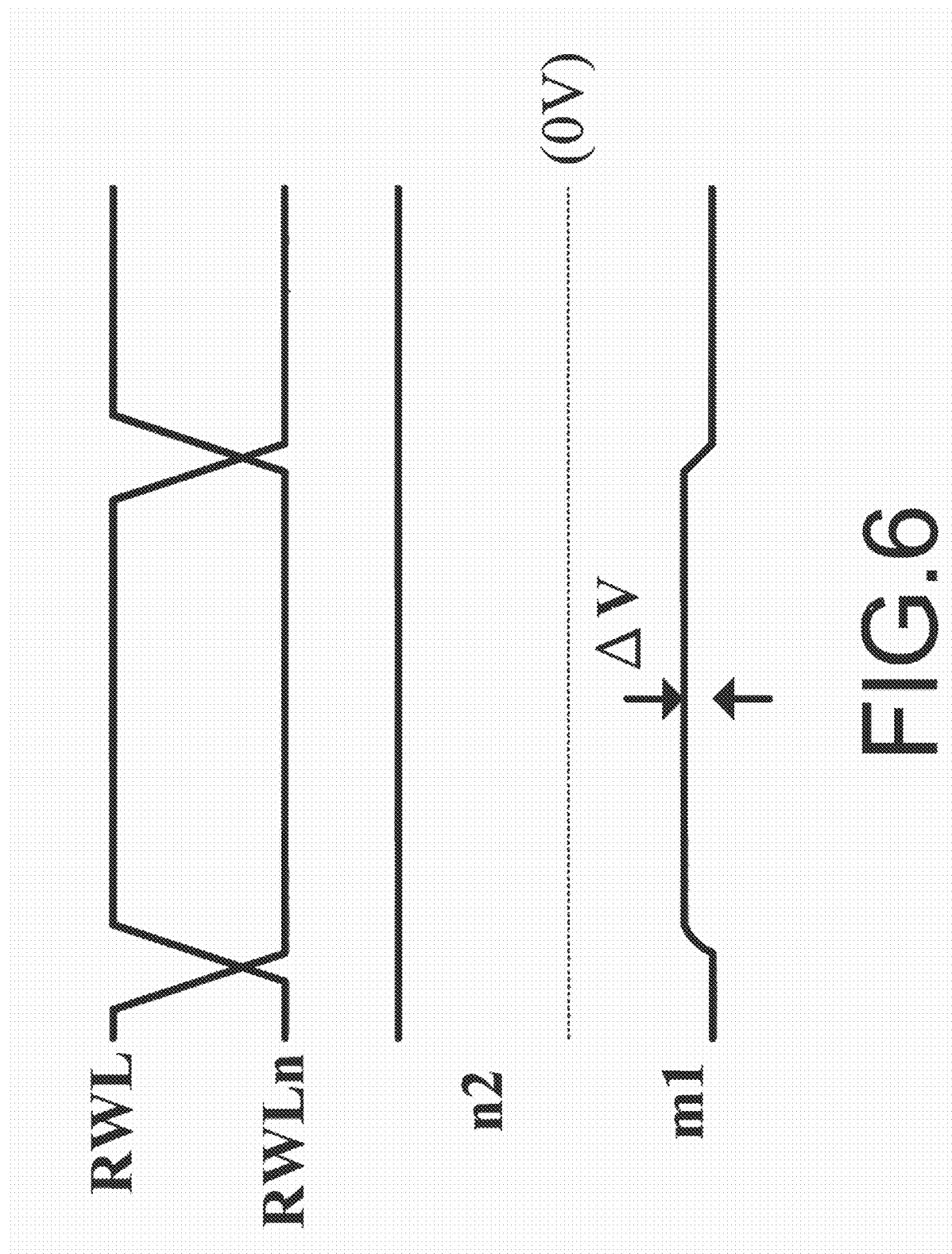
FIG. 6 is a diagram showing the waveforms of a read circuit of a NAND-type ternary CAM cell according to the present invention.

The present invention proposes a read and match circuit for a low-voltage content addressable memory. Refer to FIG. 3 for a NAND-type ternary CAM cell and a NOR-type ternary CAM cell according to the present invention. The CAM cell 31 is a NAND-type ternary CAM cell and comprises a write circuit 30, a binary/ternary setting circuit 40, a read circuit 50, a match circuit 60 and a match-line pre-charge circuit 70. The write circuit 30 undertakes writing activities. In a writing activity, the write word line WWL is at a logic state of 1. If a logic value 0 is to be stored, the write bit line WBL0 is at a logic state of 0, and the write bit line WBLn0 is at a logic state of 1. Thus, Node n1 is shifted to a logic state of 0, and Node n2 is shifted to a logic state of 1. If a logic value 1 is to be stored, the write bit line WBL0 is at a logic state of 1, and the write bit line WBLn0 is at a logic state of 0. Thus, Node n1 is shifted to a logic state of 1, and Node n2 is shifted to a logic state of 0. The binary/ternary setting circuit 40 controls the transmission of match signals. If a binary data is stored, the mask write bit line WBLX0 is at a logic state of 1, and the mask write bit line WBLXn0 is at a logic state of 0. Thus, Node n3 is shifted to a logic state of 1, and Node n4 is shifted to a logic state of 0. If a ternary data is stored, the mask write bit line WBLX0 is at a logic state of 0, and the mask write bit line WBLXn0 is at a logic state of 1. Thus, Node n3 is shifted to a logic state of 0, and Node n4 is shifted to a logic state of 1. The read circuit 50 is connected with the write circuit 30 and reads the data stored in the CAM cell. The read circuit 50 enables the read bit lines to detect the signals stored in the CAM cell. One terminal of the read circuit 50 is connected with a read bit line, and another terminal of the read circuit 50 is connected to a virtual ground. The read word line and the signals stored in the CAM cell determine whether the read bit line and the virtual ground are short-circuited. In a reading activity, the read word line RWL is at a logic state of 1, and the read word line RWLn is at a logic state of 0, and the read bit line RBL0 is at a logic state of 1 and at a floating state. If Node n2 is at a logic state of 0, the read bit line RBL0 is maintained at the logic state 1. If Node n2 is at a logic state of 1, the read bit line RBL0 is discharged to have a logic state of 0. Separating the read circuit 50 from other circuits can exempt the stored data from the influence of the read bit lines in a reading activity. The principle of static noise margin is as well as store state. Refer to FIG. 4 for the waveforms of the NAND-type ternary CAM cell in a reading activity. Suppose that Node n2 stores a logic value 0. When the read word line RWL is at a logic state of 1, the voltage level of Node n2 will not drift but maintains at the original stability. The X in FIG. 4 represents that the voltage rise denoted by the dotted line dose not occur in Node n2. When the system does not read data from the CAM cell, the read word line RWL is at a logic state of 0, and the read word line RWLn is at a logic state of 1. The read circuit 50 has two stacked transistors: one is an N-type transistor controlled by the read word lines, and the other is an N-type transistor controlled by the stored value. The stack effect will result in the rise of the threshold voltage of the N-type transistor controlled by the read word lines and thus decrease the leakage current of the read circuit of the CAM cell. Therefore, the floating-state read bit line RBL0 is less likely to be affected by the leakage current of the unread CAM cell. Refer to FIG. 5 for a read circuit of a NAND-type ternary CAM cell according to the present invention, and refer to FIG. 6 for the waveforms of a read circuit of a NAND-type ternary CAM cell according to the present invention. Suppose that Node n2 stores a logic value 1. When the read word line RWL is at a logic state of 0, the read word line RWLn is at a logic state of 1. Then, the voltage level of Node m1 rises slightly, and the bulk effect causes the threshold voltage (Vth) of the transistor 502 to rise. Thus, the leakage current of the transistor 502 is reduced.

The match circuit 60 is connected to the write circuit 30 and compares the stored data with the data searched by the match circuit 60. The match circuit 60 includes a data match circuit 602, a binary/ternary transmission circuit 604 and a match output circuit 606. The data match circuit 602 is connected with the search lines and the stored data, compares the stored data with the search lines and transfers the comparison result to the binary/ternary transmission circuit 604. The data match circuit 602 has two transmission switches. The gates of the transistors in the transmission switches are controlled by the signals stored in the CAM cell; the sources of the transmission switches are connected with the search lines; the drains of the transmission switches are connected to each other. The node where the drains are connected to each other is the comparison result. In the binary/ternary transmission circuit 604, one terminal thereof is connected with the result of the data match circuit 602; two terminals thereof are connected with the binary/ternary setting circuit 40; one terminal thereof is connected with the match output circuit 606. The binary/ternary transmission circuit 604 determines whether the result of the data match circuit 602 is transmitted to the match output circuit 606. One terminal of the match output circuit 606 is connected with the binary/ternary transmission circuit 604, and another terminal of the match output circuit 606 is connected with the match line. The match output circuit 606 controls the conduction of the transistor connecting the CAM cell with the match line. In a matching activity, if the stored data is a binary signal, Node n3 is at a logic state of 1, and Node n4 is at a logic state of 0, and the search lines SL0 and SLn0 store the searched data. When a logic value 1 is searched for, the search line SL0 has a logic value 1, and the search line SLn0 has a logic value 0. If Node n1 is at a logic state of 1, Node n5 is shifted to have a logic value 1. When the signal is transmitted to Node n6, Node n6 will also have a logic value 1.

Figure 7:
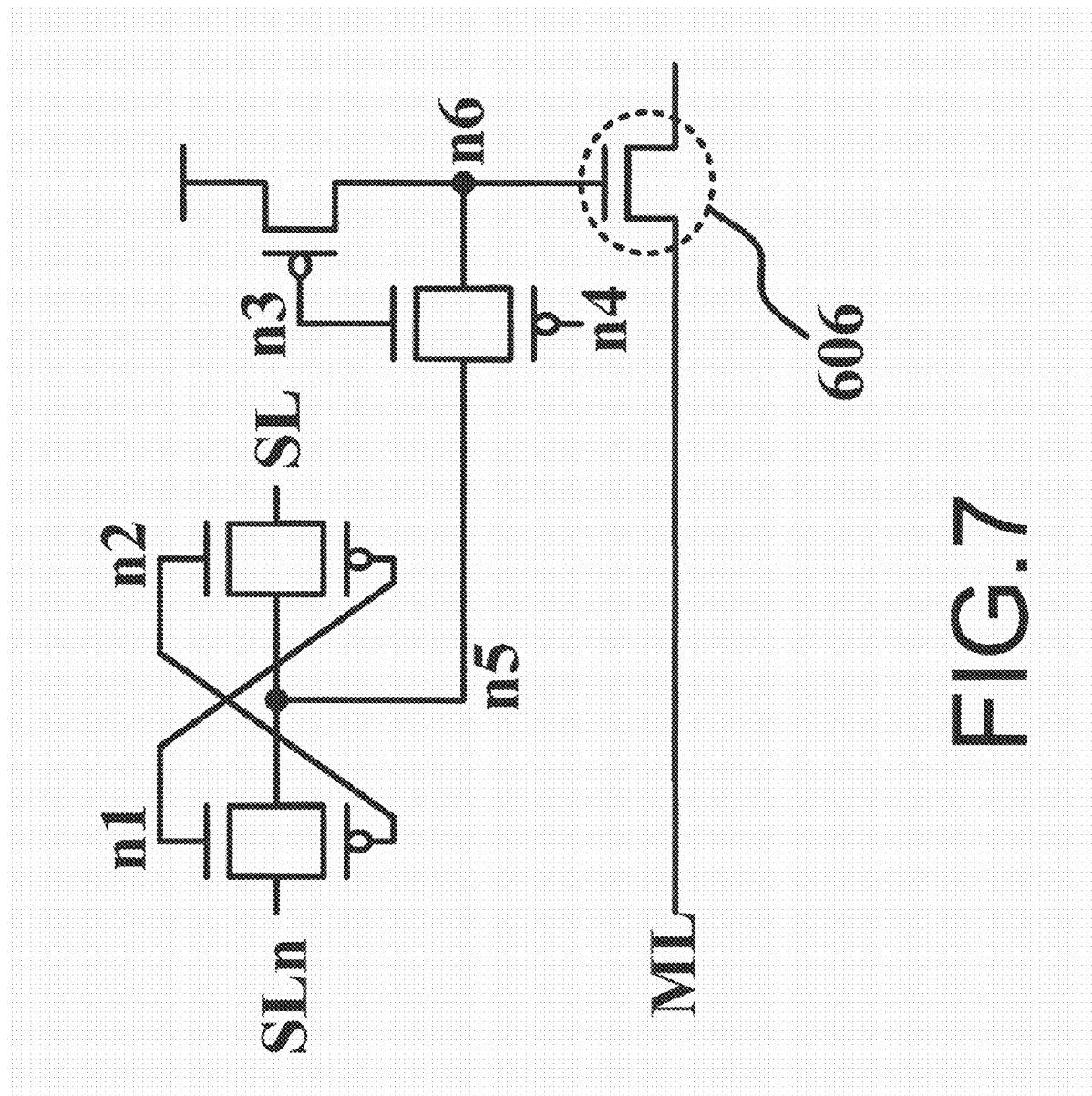
FIG. 7 is a diagram showing a data match circuit, a binary/ternary transmission circuit and a match output circuit of a NAND-type ternary CAM cell according to the present invention.
Figure 8:
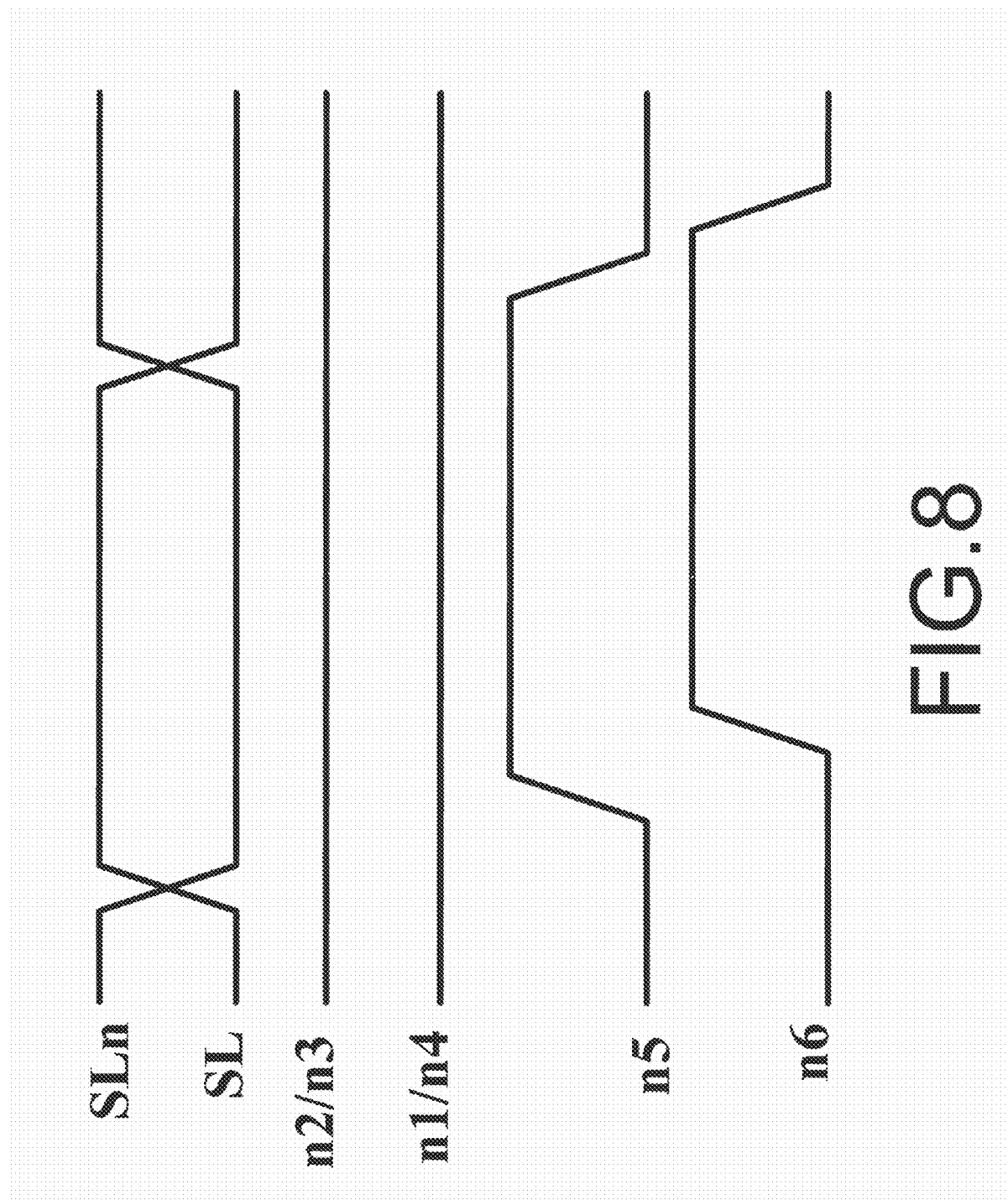
FIG. 8 is a diagram showing the waveforms of a data match circuit, a binary/ternary transmission circuit and a match output circuit of a NAND-type ternary CAM cell according to the present invention.

Refer to FIG. 7 for a data match circuit, a binary/ternary transmission circuit and a match output circuit of a NAND-type ternary CAM cell according to the present invention. Refer to FIG. 8 for the waveforms of a data match circuit, a binary/ternary transmission circuit and a match output circuit of a NAND-type ternary CAM cell according to the present invention. When the comparison result makes the match output circuit 606 turn on, it means that the bit matches the searched value. When the comparison result makes the match output circuit 606 disconnect, it means that the bit mismatches the searched value. When the stored data is a ternary signal, it means that Node n3 has a logic value 0 and Node n4 has a logic value 1, and that Node n6 has nothing to do with Node n5. If Node n6 has a logic value 1, the match output circuit 606 turns on, and it means that the bit matches the searched value. The match-line pre-charge circuit 70 is used to charge the match lines shown in FIG. 3. The NAND-type CAM cell and the match-line pre-charge circuit 70 can form a dynamic NAND-type match-line circuit. The NOR-type CAM cell and the match-line pre-charge circuit 70 can form a dynamic NOR-type match-line circuit. The NAND-type CAM cell, the NOR-type CAM cell, and the match-line pre-charge circuit 70 can form a dynamic NAND-NOR type or AND-NOR type match-line circuit.

Figure 9:
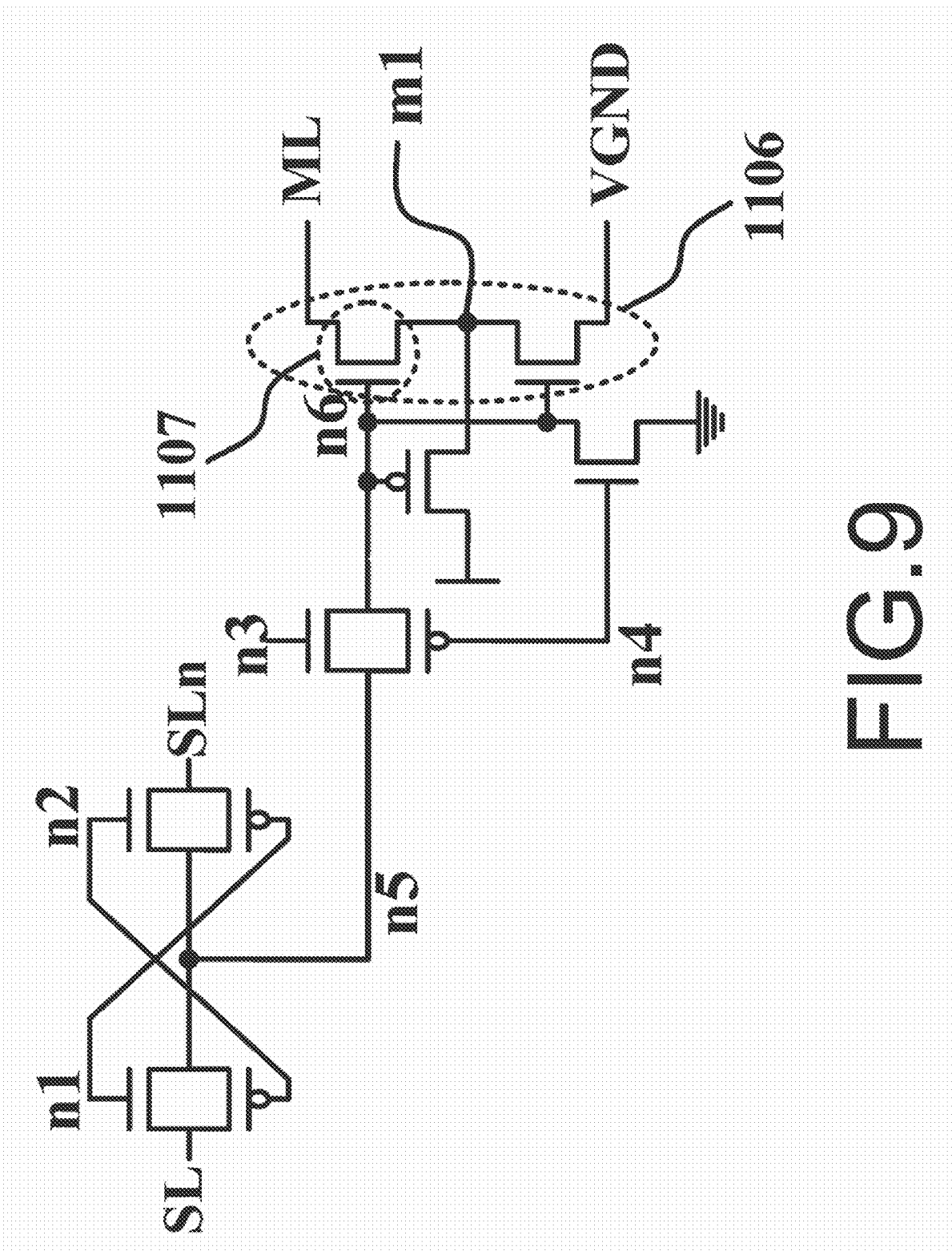
FIG. 9 is a diagram showing a data match circuit, a binary/ternary transmission circuit and a match output circuit of a NOR-type ternary CAM cell according to the present invention.

The CAM cell 32 in FIG. 3 is a NOR-type ternary CAM cell. Refer to FIG. 9 for a data match circuit, a binary/ternary transmission circuit and a match output circuit of a NOR-type ternary CAM cell according to the present invention. The NOR-type ternary CAM cell 32 comprises a write circuit 80, a binary/ternary setting circuit 90, a read circuit 100 and a match circuit 110. The write circuit 80 undertakes writing activities. In a writing activity, the write word line WWL is at a logic state of 1. If a logic value 0 is to be stored, the write bit line WBL1 is at a logic state of 0, and the write bit line WBLn1 is at a logic state of 1. Thus, Node n8 is shifted to a logic state of 1, and Node n7 is shifted to a logic state of 0. If a logic value 1 is to be stored, the write bit line WBL1 is at a logic state of 1, and the write bit line WBLn1 is at a logic state of 0. Thus, Node n8 is shifted to a logic state of 0, and Node n7 is shifted to a logic state of 1. The binary/ternary setting circuit 90 controls the transmission of match signals. If a binary data is stored, the mask write bit line WBLX1 is at a logic state of 1, and the mask write bit line WBLXn1 is at a logic state of 0. Thus, Node n9 is shifted to a logic state of 1, and Node n10 is shifted to a logic state of 0. If a ternary data is stored, the mask write bit line WBLX1 is at a logic state of 0, and the mask write bit line WBLXn1 is at a logic state of 1. Thus, Node n9 is shifted to a logic state of 0, and Node n10 is shifted to a logic state of 1. The read circuit 100 is connected with the write circuit 80 and reads the data stored in the CAM cell. In a reading activity, the read word line RWL is at a logic state of 1, and the read word line RWLn is at a logic state of 0, and the read bit line RBL1 is at a logic state of 1 and at a floating state. If Node n8 is at a logic state of 0, the read bit line RBL1 is maintained at the logic state 1. If Node n8 is at a logic state of 1, the read bit line RBL1 is discharged to have a logic state of 0.

The match circuit 110 is connected to the write circuit 80 and compares the stored data with the data searched by the match circuit 110. The match circuit 110 includes a data match circuit 1102, a binary/ternary transmission circuit 1104 and a match output circuit 1106. The data match circuit 1102 is connected with the search lines (SL1 and SLn1) and the stored data, compares the stored data with the match lines and transfers the comparison result to the binary/ternary transmission circuit 1104. The data match circuit 1102 has two transmission switches. The gates of the transistors in the transmission switches are controlled by the signals stored in the CAM cell; the sources of the transmission switches are connected with the search lines; the drains of the transmission switches are connected to each other. The node where the drains are connected to each other is the comparison result. In the binary/ternary transmission circuit 1104, one terminal thereof is connected with the result of the data match circuit 1102; two terminals thereof are connected with the binary/ternary setting circuit 90; one terminal thereof is connected with the match output circuit 1106. The binary/ternary transmission circuit 1104 determines whether the result of the data match circuit 1102 is transmitted to the match output circuit 1106. One terminal of the match output circuit 1106 is connected with the binary/ternary transmission circuit 1104, and another terminal of the match output circuit 1106 is connected with the match line. The match output circuit 1106 controls the conduction of the transistor connecting the CAM cell with the match line. In a matching activity, if the stored data is a binary signal, Node n9 is at a logic state of 1, and Node n10 is at a logic state of 0, and the search lines SL1 and SLn1 store the searched data. When a logic value 1 is searched for, the search line SL1 has a logic value 1, and the search line SLn1 has a logic value 0. If Node n7 is at a logic state of 1, Node n1 is shifted to have a logic value 0. When the signal is transmitted to Node n12, Node n12 will also have a logic value 0.

Figure 10:
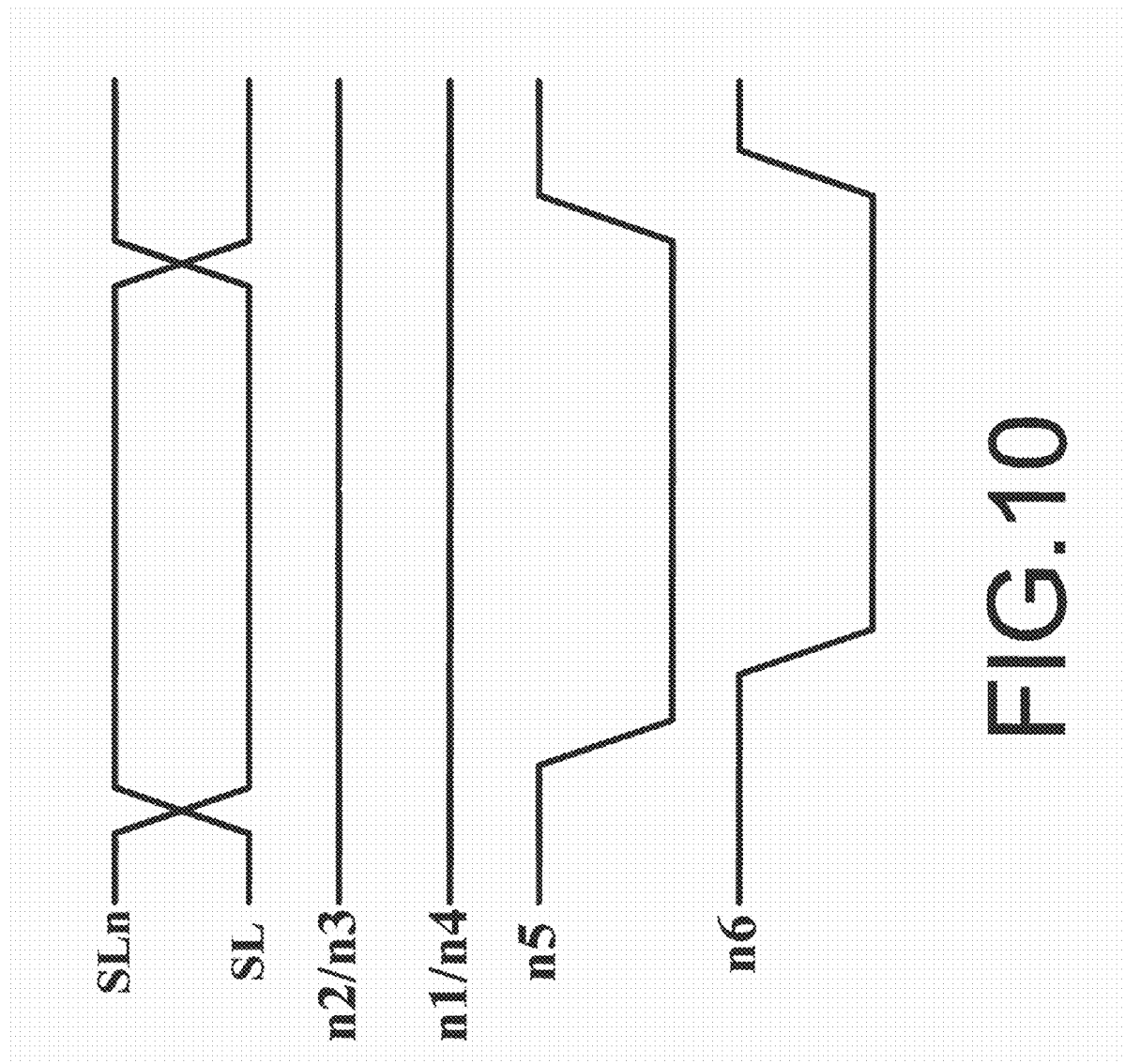
FIG. 10 is a diagram showing the waveforms of a data match circuit, a binary/ternary transmission circuit and a match output circuit of a NOR-type ternary CAM cell according to the present invention.

Refer to FIG. 9 for a data match circuit, a binary/ternary transmission circuit and a match output circuit of a NOR-type ternary CAM cell according to the present invention. Refer to FIG. 10 for the waveforms of a data match circuit, a binary/ternary transmission circuit and a match output circuit of a NOR-type ternary CAM cell according to the present invention. When the comparison result makes the match output circuit 1106 disconnect, it means that the bit matches the searched value. When the stored data is a binary signal, it means that Node n3 has a logic value 1 and Node n4 has a logic value 0. When the comparison result makes Node n5 have a logic value 1, Node n6 is shifted to a logic state of 1, and the match output circuit 1106 turns on. It means that the bit mismatches the searched value. When the stored data is a ternary signal, it means that Node n3 has a logic value 0 and Node n4 has a logic value 1, and that Node n6 has nothing to do with Node n5. If Node n6 has a logic value 0, the match output circuit 1106 disconnects, and it means that the bit matches the searched value. The stack technology is applied to the circuit shown in FIG. 9. When the bit matches the searched value, Node n6 has a logic value 0, and Node m1 has a logic value 1. Thus, the stack effect increases the threshold voltage (Vth) of a transistor 1107 and then decreases the leakage current of the transistor 1107. Thereby, the match line ML is less likely to be affected by the leakage current of the transistor connected with the match line.

Figure 11:
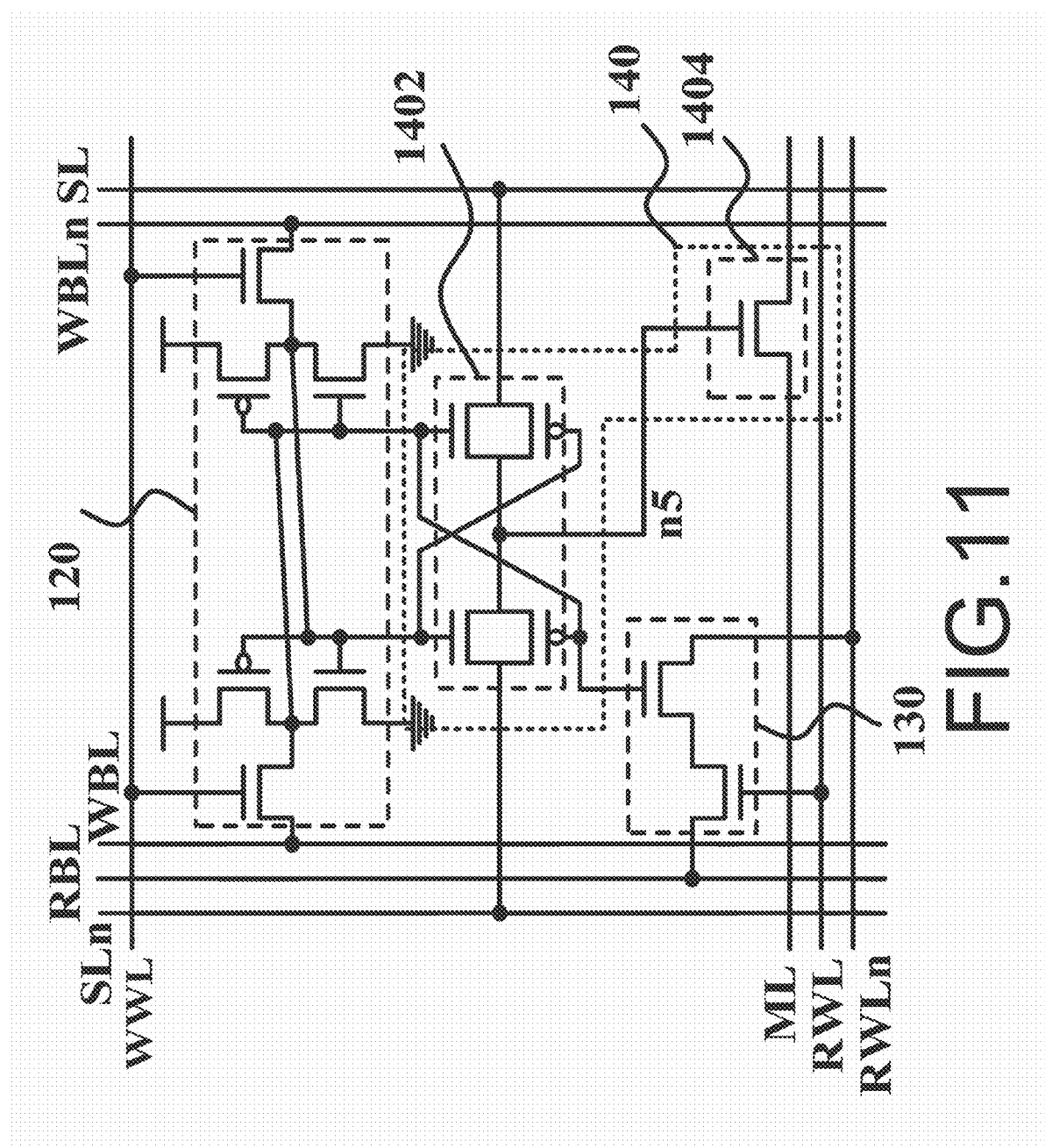
FIG. 11 is a diagram showing a binary NAND-type CAM cell according to the present invention.
Figure 12:
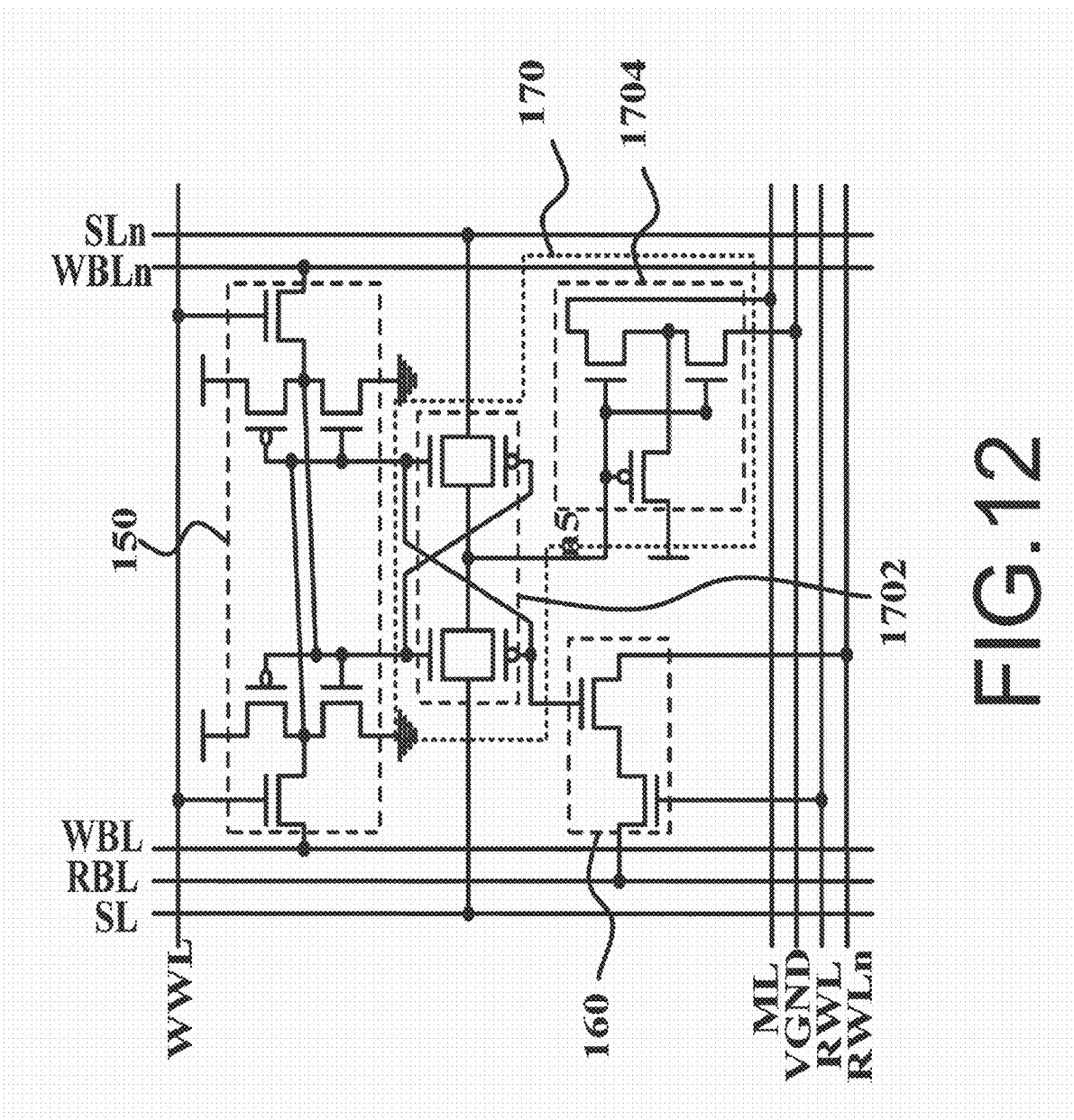
FIG. 12 is a diagram showing a binary NOR-type CAM cell according to the present invention.

According to the application, the size of transistors is optimized to prevent from mutual interference. According to requirement, the CAM cell may be revised into a binary CAM cell. Refer to FIG. 11 a diagram showing a binary NAND-type CAM cell according to the present invention. The binary NAND-type CAM cell comprises a write circuit 120, a read circuit 130 and a match circuit 140. The match circuit 140 includes a data match circuit 1402 and a match output circuit 1404. The reading operation and writing operation of the binary NAND-type CAM cell are similar to that of the NAND-type ternary CAM cell 31 in FIG. 3, but the matching operation is slightly different. The binary NAND-type CAM cell in FIG. 11 does not have the binary/ternary setting circuit in the NAND-type ternary CAM cell 31 of FIG. 3. The operation of Node n5 in FIG. 11 is similar to Node n5 in FIG. 3. When Node n5 has a logic value 1, the match output circuit 1404 turns on, and it means that the bit matches the searched value. When Node n5 has a logic value 0, the match output circuit 1404 disconnects, and it means that the bit mismatches the searched value. Refer to FIG. 12 a diagram showing a binary NOR-type CAM cell according to the present invention. The binary NOR-type CAM cell comprises a write circuit 140, a read circuit 160 and a match circuit 170. The match circuit 170 includes a data match circuit 1702 and a match output circuit 1704. The reading operation and writing operation of the binary NOR-type CAM cell are similar to that of the NOR-type ternary CAM cell 32 in FIG. 3, but the binary NOR-type CAM cell in FIG. 12 does not have the binary/ternary setting circuit in the NOR-type ternary CAM cell 32 of FIG. 3. The operation of Node n5 in FIG. 12 is similar to Node n1 in FIG. 3. When Node n5 has a logic value 0, the N-type transistor of the match output circuit 1704 disconnects, and it means that the bit matches the searched value. When Node n5 has a logic value 1, the N-type transistor of the match output circuit 1704 turns on, and it means that the bit mismatches the searched value.

Figure 13:
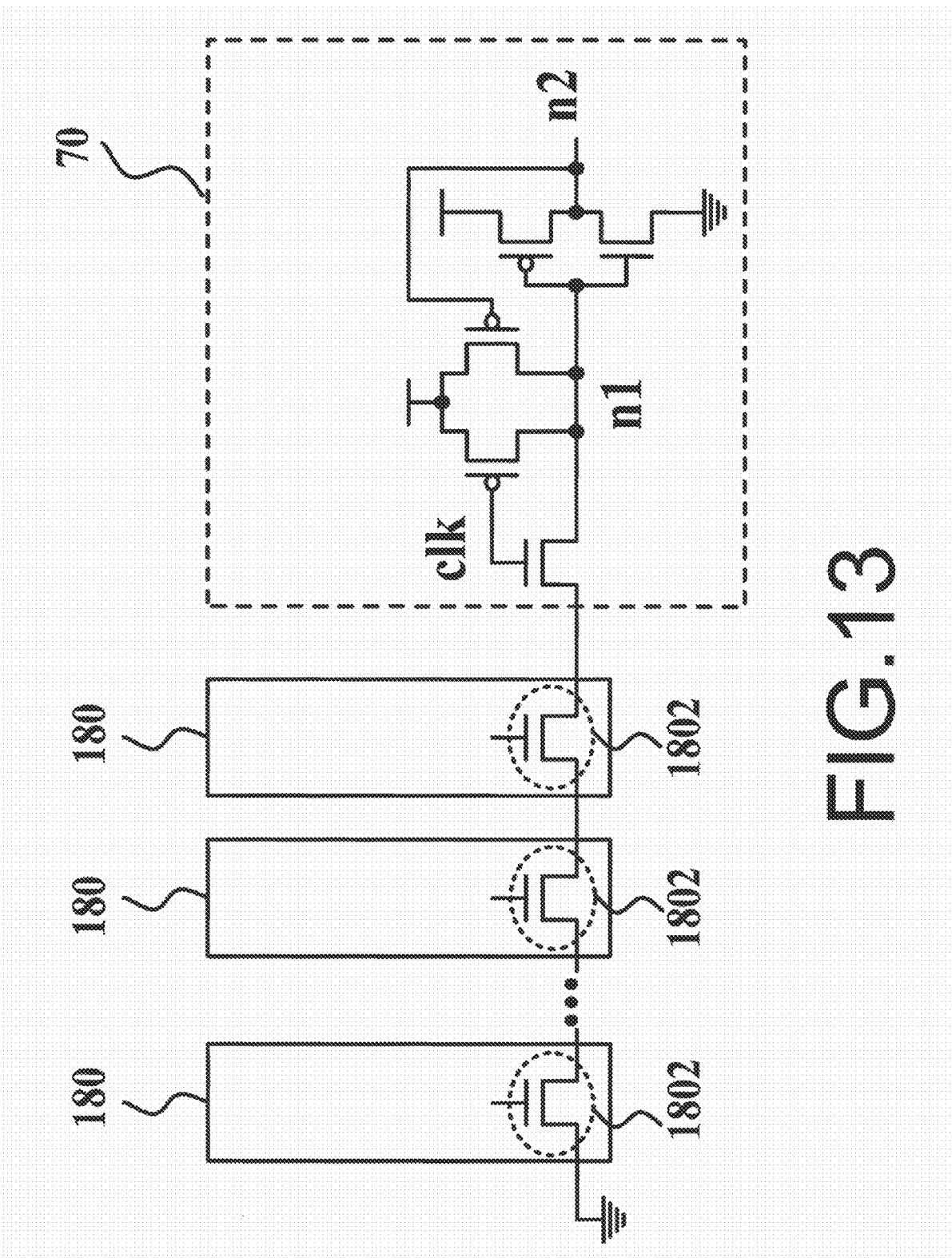
FIG. 13 is a diagram showing a first embodiment of the application of the present invention.

The NAND-type CAM cell can apply to the NAND-type match-line circuit and the AND-type match-line circuit. Refer to FIG. 13 for a first embodiment of the application of the present invention. The NAND-type CAM cell 180 may be the NAND-type ternary CAM cell 31 in FIG. 3 or the binary NAND-type CAM cell in FIG. 11, and the match output circuit 1802 may be the match output circuit 606 in FIG. 7 or the match output circuit 1404 in FIG. 11. In a pre-charge state, the control line clk of the match-line pre-charge circuit 70 has a logic value 0, and Node n1 has a logic value 1, and Node n2 has a logic value 0. Whether the bit matches the searched value determines whether the transistor of the match output circuit 1802 turns on or disconnects. When the bit matches the searched value, the corresponding transistor turns on. When the bit mismatches the searched value, the corresponding transistor disconnects. In an evaluate state, the control line clk has a logic value 1. If all the bits in the match output circuit 1802 match the searched values, Node n1 will be discharged to have a logic value 0, and Node n2 is shifted to a logic state of 1. If at least one of the bits in the match output circuit 1802 does not match the searched values, Nodes n1 and n2 are maintained at the pre-charge state.

Figure 14:
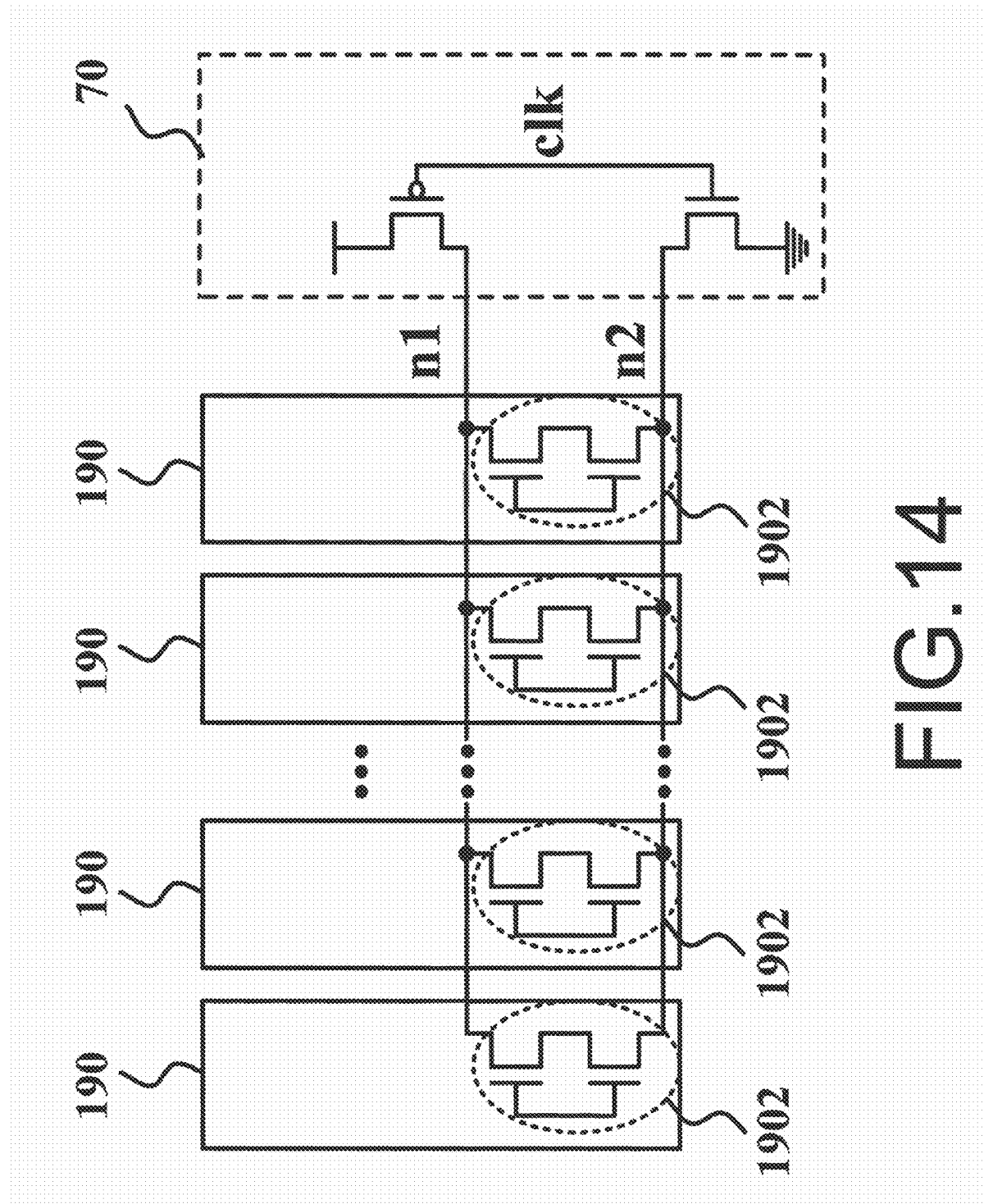
FIG. 14 is a diagram showing a second embodiment of the application of the present invention.

The NOR-type CAM cell can apply to the NOR-type match-line circuit. Refer to FIG. 14 for a second embodiment of the application of the present invention. The NOR-type CAM cell 190 may be the NOR-type ternary CAM cell 32 in FIG. 3 or the binary NOR-type CAM cell in FIG. 12, and the match output circuit 1902 may be the match output circuit 1106 in FIG. 9 or the match output circuit 1704 in FIG. 12. In a pre-charge state, the control line clk has a logic value 0, and Node n1 has a logic value 1. Whether the bit matches the searched value determines whether the transistor of the match output circuit 1902 turns on or disconnects. If the bit matches the searched value, the corresponding transistor of the match output circuit 1902 disconnects. If the bit mismatches the searched value, the corresponding transistor of the match output circuit 1902 turns on. In an evaluate state, the control line clk has a logic value 1, and Node n2 has a logic value 0. If all the bits in the match output circuit 1902 match the searched values, Node n1 is maintained at a logic state of 1. If at least one of the bits in the NOR-type CAM cell 190 does not match the searched values, Node n1 is discharged to have a logic value 0.

Figure 15:
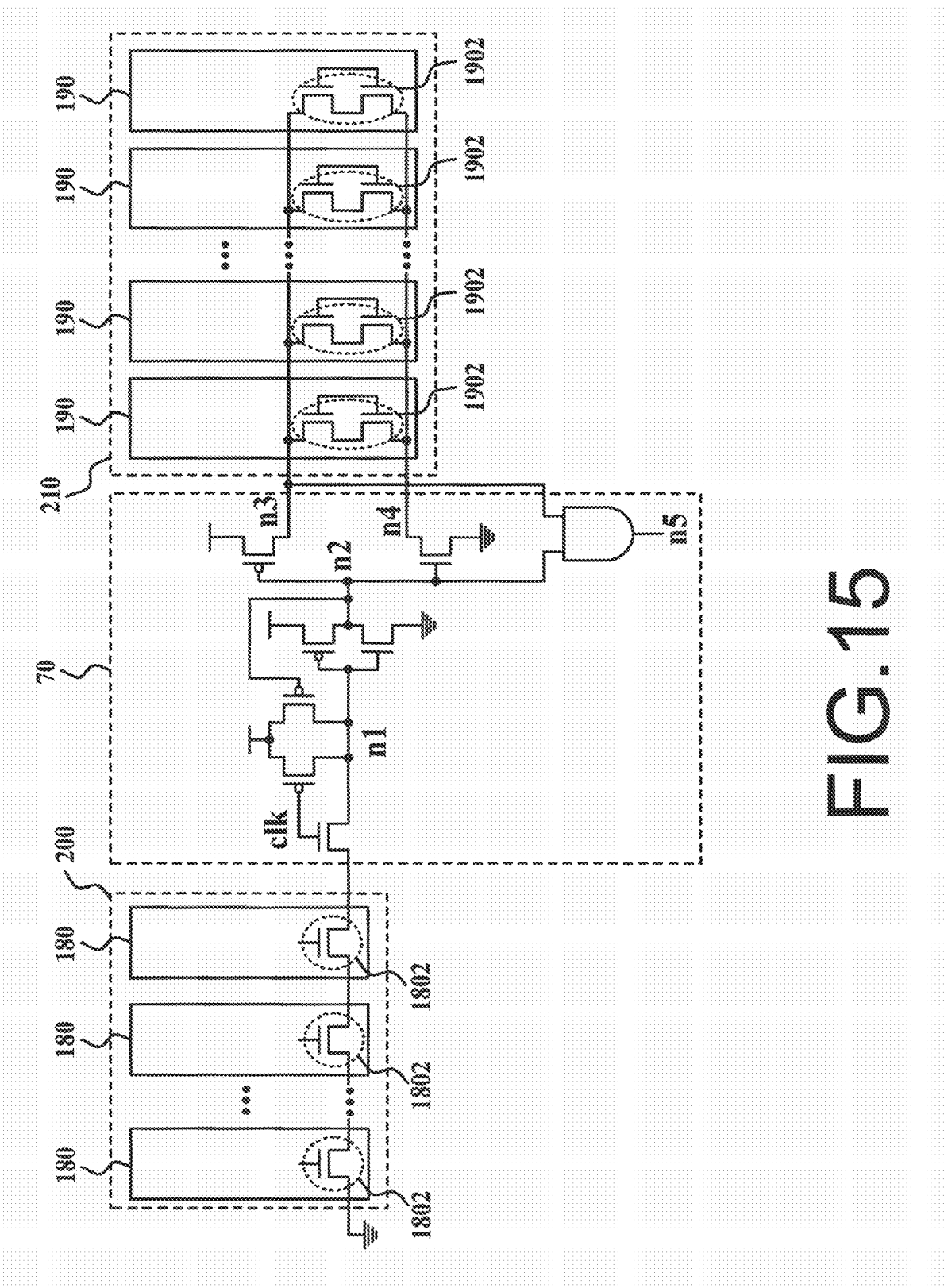
FIG. 15 is a diagram showing a third embodiment of the application of the present invention.

The NAND-type CAM cell and the NOR-type CAM cell may also be used in an identical match line simultaneously. Refer to FIG. 15 for a third embodiment of the application of the present invention. The NAND-type CAM cell group 200 may be the same as that shown in FIG. 13, and the NOR-type CAM cell group 210 may be the same as that shown in FIG. 14. In a pre-charge state, the control line clk has a logic value 0; Node n1 has a logic value 1; Node n2 has a logic value 0; Node n3 has a logic value 1; Node n5 has a logic value 0. The NAND-type CAM cell group 200 and the NOR-type CAM cell group 210 simultaneously undertake bit matching activities. In an evaluate state, the control line clk has a logic value 1. If all the bits of the NAND-type CAM cell 200 hit the searched values, Node n2 is shifted to a logic state of 1. If the bits of the NAND-type CAM cell 200 do not all hit the searched values, Node n2 is maintained at a logic state of 0, and Node n5 also has a logic value 0. When Node n1 is shifted to a logic state of 1, Node n4 is shifted to a logic state of 0. If all the bits of the NOR-type CAM cell 210 hit the searched values, Node n3 is maintained at a logic state of 1, and Node n5 also has a logic value 1. If at least one of the bits does not hit, Node n3 is discharged to have a logic value 0, and Node n5 is shifted to a logic state of 0.

Figure 16:
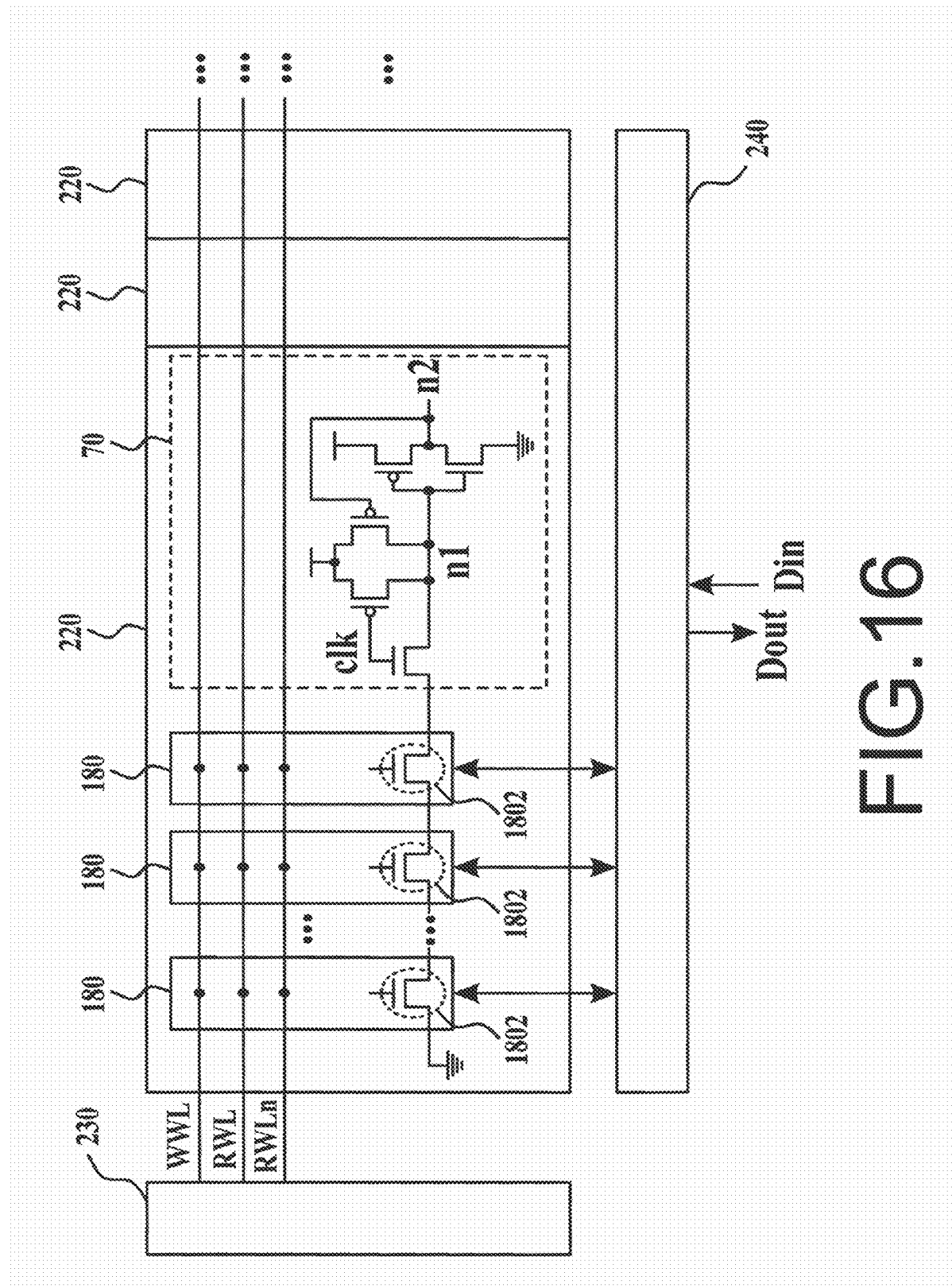
FIG. 16 is a diagram showing that the NAND-type cell of the present invention is realized in a binary/ternary CAM.
Figure 17:
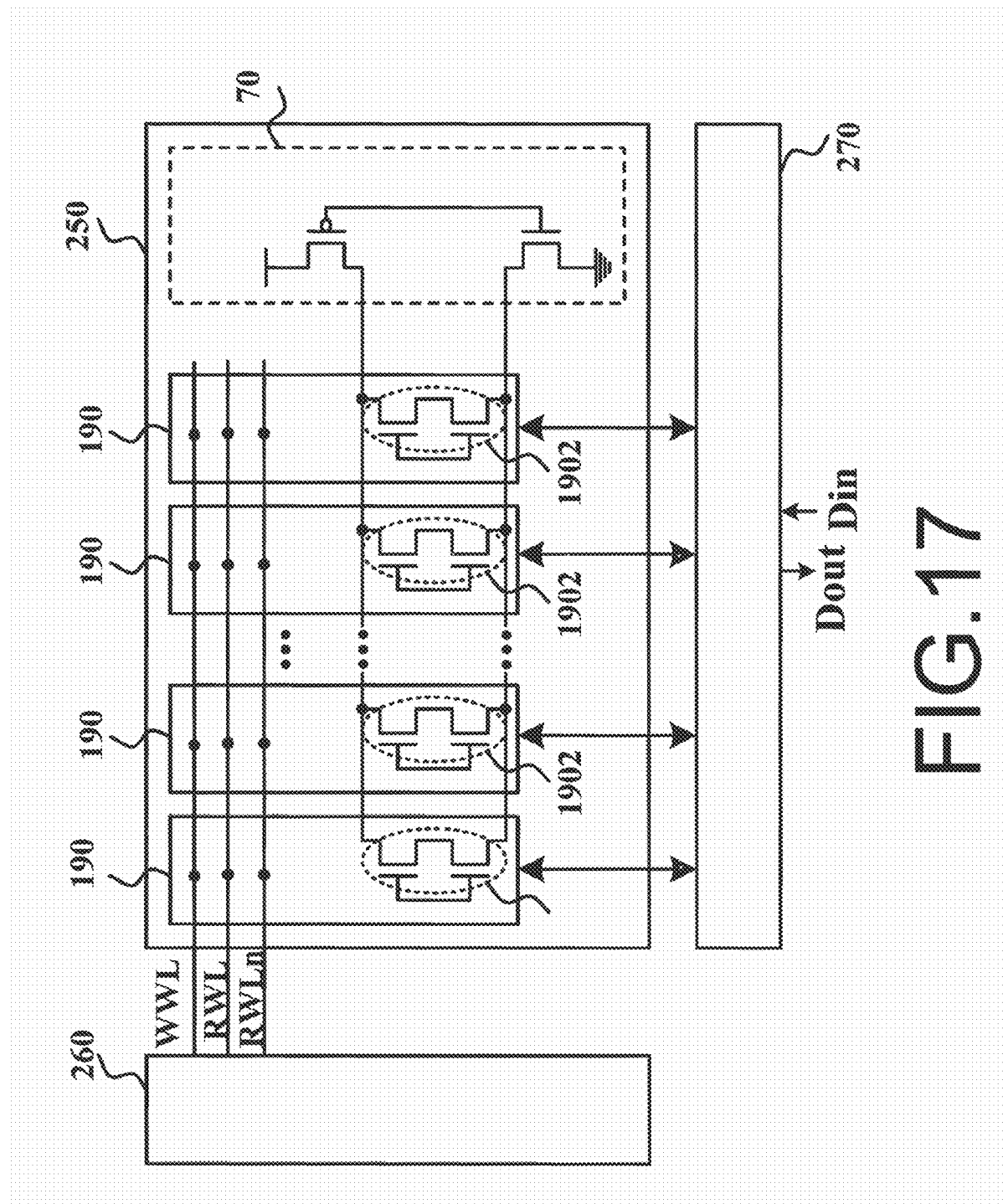
FIG. 17 is a diagram showing that the NOR-type cell of the present invention is realized in a binary/ternary CAM.
Figure 18:
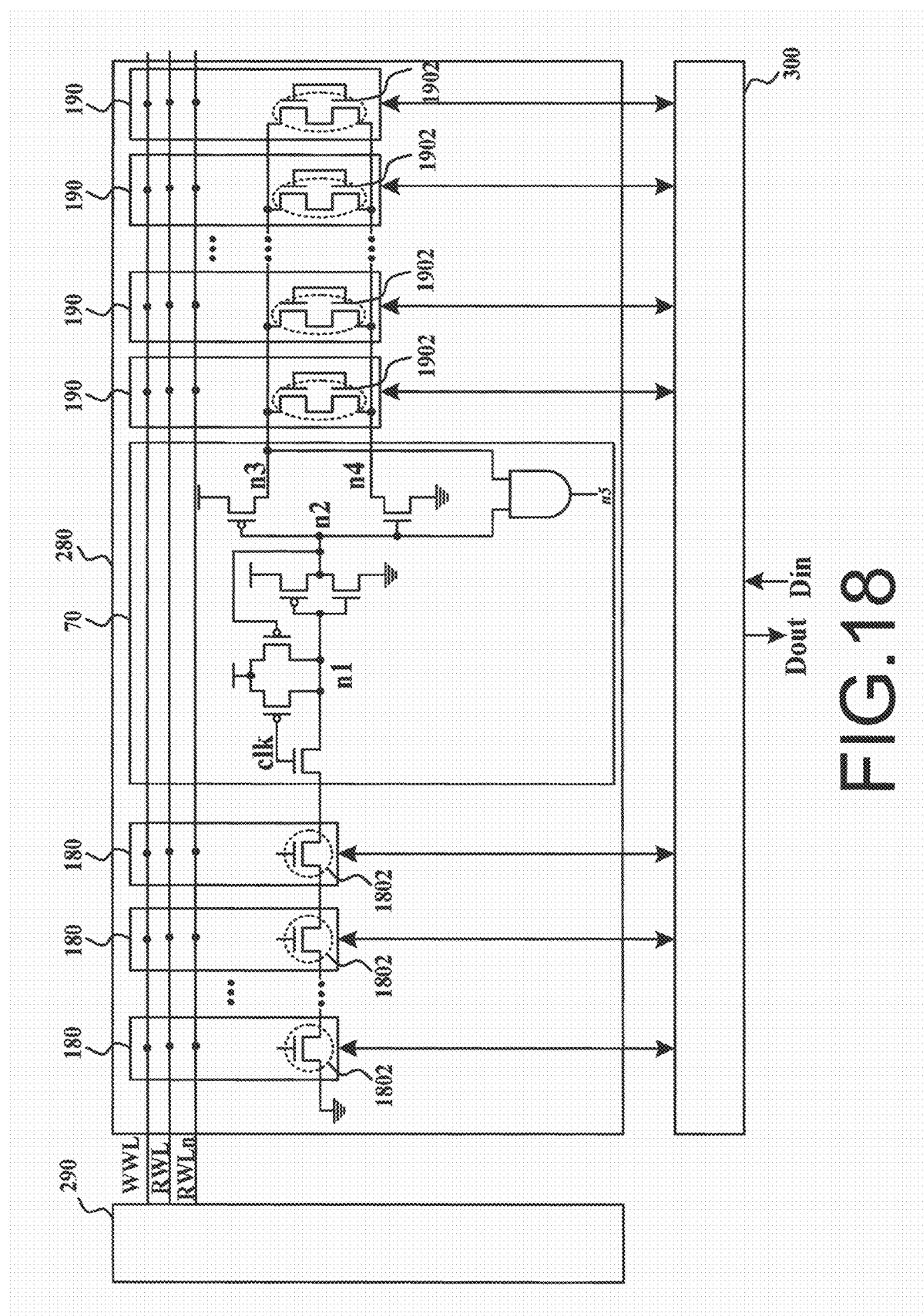
FIG. 18 is a diagram showing that the NAND-type cell and the NOR-type cell of the present invention are realized in a binary/ternary CAM.

Refer to FIG. 16 a diagram showing that the NAND-type cell of the present invention is realized in a binary/ternary CAM, wherein the CAM comprises NAND-type match-line circuits 220 having the architecture shown in FIG. 13, an address decoder 230 where control lines WWL, RWL and RWLn originate, and a write/read/search buffer 240. When performing writing or searching, the write/read/search buffer 240 transmits external signals into the memory cells. When performing reading, the write/read/search buffer 240 transfers the data stored in the memory cells to the external circuit. The operating process thereof is similar to that mentioned above. Refer to FIG. 17 a diagram showing that the NOR-type cell of the present invention is realized in a binary/ternary CAM, wherein the CAM comprises NOR-type match-line circuits 220 having the architecture shown in FIG. 14, an address decoder 260 where control lines WWL, RWL and RWLn originate, and a write/read/search buffer 270. When performing writing or searching, the write/read/search buffer 270 transmits external signals into the memory cells. When performing reading, the write/read/search buffer 270 transfers the data stored in the memory cells to the external circuit. The operating process thereof is similar to that mentioned above. Refer to FIG. 18 a diagram showing that the NAND-type cell and the NOR-type cell of the present invention are realized in a binary/ternary CAM, wherein the CAM comprises NAND-NOR-type match-line circuits 280 having the architecture shown in FIG. 15, an address decoder 290, and a write/read/search buffer 300. The operating process thereof is similar to that mentioned above.

In conclusion, the present invention has the advantages of achieving lower power consumption in a low-voltage system and optimizing the read, write and match sub-circuits to overcome the problems of current leakage and noise allowance.

The embodiments described above are only to exemplify the present invention but not to limit the scope of the present invention. Therefore, any equivalent modification or variation according to the characteristics or spirit of the present invention is to be also included within the scope of the present invention.

What is claimed is:

1. A read, write, and match circuit for a low-voltage content addressable memory comprising,
    a write circuit undertaking writing activities;
    a binary/ternary setting circuit controlling transmission of match signals;
    a read circuit connected with said write circuit and reading data stored in a memory cell;
    a match circuit connected with said write circuit and comparing stored data with data searched by said match circuit; and
    said match circuit, said write circuit and said read circuit are separated from each other and exempt from mutual interference.

2. The read, write, and match circuit for a low-voltage content addressable memory according to claim 1, wherein said read circuit enables read bit lines to detect a signal stored in a memory cell; one terminal of said read circuit is connected with a read bit line, and another terminal of said read circuit is connected to a virtual ground; a read word line and a signal stored in a memory cell determine whether said read bit line and said virtual ground are short-circuited.

3. The read, write, and match circuit for a low-voltage content addressable memory according to claim 1, wherein said read circuit has two stacked transistors: one is an NMOS (N-type Metal Oxide Semiconductor) transistor controlled by read word lines, and the other is an NMOS transistor controlled by a value stored in a memory cell.

4. The read, write, and match circuit for a low-voltage content addressable memory according to claim 1, wherein said match circuit includes a data match circuit, a binary/ternary transmission circuit and a match output circuit.

5. The read, write, and match circuit for a low-voltage content addressable memory according to claim 4, wherein said data match circuit is connected with search lines and data stored in a memory cell, compares said data match circuit with said search lines, and transfers a comparison result to said binary/ternary transmission circuit.

6. The read, write, and match circuit for a low-voltage content addressable memory according to claim 4, wherein in said binary/ternary transmission circuit, one terminal thereof is connected with a result of said data match circuit; two terminals thereof are connected with said binary/ternary setting circuit; one terminal thereof is connected with said match output circuit; said binary/ternary transmission circuit determines whether a result of the data match circuit is transmitted to said match output circuit.

7. The read, write, and match circuit for a low-voltage content addressable memory according to claim 4, wherein one terminal of said match output circuit is connected with said binary/ternary transmission circuit, and another terminal of said match output circuit is connected with a match line; said match output circuit controls whether transistors on said match line is turned on.

8. The read, write, and match circuit for a low-voltage content addressable memory according to claim 4, wherein said data match circuit has two transmission switches; gates of transistors in said transmission switches are controlled by signals stored in a memory cell; sources of said transmission switches are connected with search lines; drains of said transmission switches are connected to each other; a node where said drains are connected to each other is a comparison result.

9. The read, write, and match circuit for a low-voltage content addressable memory according to claim 1, wherein said low-voltage content addressable memory contains NAND-type memory cells and NOR-type memory cells.

10. The read, write, and match circuit for a low-voltage content addressable memory according to claim 9, wherein said NAND-type memory cells and a match-line pre-charge circuit form a dynamic NAND-type match-line circuit or a dynamic AND-type match-line circuit.

11. The read, write and match circuit for a low-voltage content addressable memory according to claim 9, wherein said NOR-type memory cells and a match-line pre-charge circuit form a dynamic NOR-type match-line circuit.

12. The read, write, and match circuit for a low-voltage content addressable memory according to claim 9, wherein said NAND-type memory cells, said NOR-type memory cells and a match-line pre-charge circuit form a dynamic NAND-NOR-type match-line circuit.

13. The read, write, and match circuit for a low-voltage content addressable memory according to claim 10, wherein said NAND-type memory cells, said NOR-type memory cells and a match-line pre-charge circuit form a dynamic a dynamic AND-NOR-type match-line circuit.

14. The read, write, and match circuit for a low-voltage content addressable memory according to claim 1 further comprising a write/read/search buffer and an address decoder.

* * * * *